(12) United States Patent
Zaks et al.

(10) Patent No.: US 8,796,060 B2
(45) Date of Patent: *Aug. 5, 2014

(54) METHOD OF MANUFACTURING PHOTOVOLTAIC CELLS, PHOTOVOLTAIC CELLS PRODUCED THEREBY AND USES THEREOF

(75) Inventors: Marat Zaks, Krasnodar (RU); Galina Kolomoets, Krasnodar (RU); Andrey Sitnikov, Krasnodar (RU); Oleg Solodukha, Krasnodar (RU)

(73) Assignee: Solar Wind Technologies, Inc., San Francisco, CA (US)

( * ) Notice: Subject to any disclaimer, the term of this patent is extended or adjusted under 35 U.S.C. 154(b) by 841 days.

This patent is subject to a terminal disclaimer.

(21) Appl. No.: 12/947,841

(22) Filed: Nov. 17, 2010

(65) Prior Publication Data

US 2011/0114151 A1 May 19, 2011

Related U.S. Application Data

(63) Continuation-in-part of application No. 12/591,390, filed on Nov. 18, 2009, now Pat. No. 8,586,862, and a continuation-in-part of application No. 12/591,391, filed on Nov. 18, 2009, now abandoned.

(51) Int. Cl.
*H01L 31/00* (2006.01)

(52) U.S. Cl.
USPC .......................... 438/57; 438/71; 257/E31.13

(58) Field of Classification Search
USPC ............. 438/57, 71–74, 96–99; 136/244, 355
See application file for complete search history.

(56) References Cited

U.S. PATENT DOCUMENTS

| 3,549,411 | A | 12/1970 | Bean et al. |
| 4,152,824 | A | 5/1979 | Gonsiorawski |
| 4,322,571 | A | 3/1982 | Stanbery |
| 4,543,444 | A | 9/1985 | Rasch et al. |
| 4,916,503 | A | 4/1990 | Uematsu et al. |
| 4,989,059 | A | 1/1991 | Micheels et al. |
| 5,110,370 | A | 5/1992 | Vogeli et al. |
| 5,609,694 | A | 3/1997 | Asai |
| 5,665,175 | A | 9/1997 | Safir |

(Continued)

FOREIGN PATENT DOCUMENTS

| EP | 1763086 | 3/2007 |
| EP | 1968123 | 9/2008 |

(Continued)

OTHER PUBLICATIONS

International Search Report and the Written Opinion Dated Nov. 18, 2011 From the International Searching Authority Re. Application No. PCT/IB2010/055219.

(Continued)

*Primary Examiner* — Savitr Mulpuri

(57) ABSTRACT

Novel methods of producing photovoltaic cells are provided herein, as well as photovoltaic cells produced thereby, and uses thereof. In some embodiments, a method as described herein comprises doping a substrate so as to form a $p^+$ layer on one side and an $n^+$ layer on an another side, removing at least a portion of the $n^+$ layer, and then forming a second $n^+$ layer, such that a concentration of the n-dopant in the second $n^+$ layer is variable throughout a surface of the substrate.

34 Claims, 5 Drawing Sheets

(56) References Cited

U.S. PATENT DOCUMENTS

| | | | |
|---|---|---|---|
| 5,871,591 | A | 2/1999 | Ruby et al. |
| 6,093,882 | A * | 7/2000 | Arimoto ................. 136/252 |
| 6,096,968 | A | 8/2000 | Schlosser et al. |
| 6,147,297 | A | 11/2000 | Wettling et al. |
| 6,180,869 | B1 | 1/2001 | Meier et al. |
| 6,277,667 | B1 | 8/2001 | Huang et al. |
| 6,524,880 | B2 | 2/2003 | Moon et al. |
| 6,552,414 | B1 | 4/2003 | Horzel et al. |
| 6,825,104 | B2 | 11/2004 | Horzel et al. |
| 6,846,984 | B2 | 1/2005 | Fath et al. |
| 7,317,237 | B2 | 1/2008 | Niira et al. |
| 7,375,378 | B2 | 5/2008 | Manivannan et al. |
| 7,495,167 | B2 | 2/2009 | Joge et al. |
| 7,498,508 | B2 | 3/2009 | Rubin et al. |
| 8,222,516 | B2 * | 7/2012 | Cousins ................. 136/255 |
| 8,349,637 | B2 * | 1/2013 | Schmid et al. ............ 438/57 |
| 2009/0227061 | A1 * | 9/2009 | Bateman et al. ........... 438/57 |
| 2010/0032012 | A1 * | 2/2010 | Isaka et al. ............. 136/256 |
| 2010/0037946 | A1 * | 2/2010 | Yatabe et al. ............ 136/256 |

FOREIGN PATENT DOCUMENTS

| | | |
|---|---|---|
| RU | 2139601 | 12/1998 |
| WO | WO 2006/012840 | 2/2006 |
| WO | WO 2007/071064 | 6/2007 |
| WO | WO 2007/111722 | 10/2007 |
| WO | WO 2009/010585 | 1/2009 |
| WO | WO 2011/061693 | 5/2011 |
| WO | WO 2011/061694 | 5/2011 |

OTHER PUBLICATIONS

Ghozati et al. "Improved Fill-Factor for the Double-Sided Buried-Contact Bifacial Silicon Solar Cell", Solar Energy Materials and Solar Cells, XP004111818, 51(2): 121-128, Feb. 24, 1998. Abstract, Fig. 1, Table 1, Section 2, p. 123-124.

Untila et al. "TCO/(N+NP+)C-Si/TCO Laminated Grid Solar Cell: Effect of Emitter Doping Profile", Proceedings of the 17th European Photovoltaic Solar Energy Conference, Munich, Germany, Oct. 22-26, 2001, XP001139809, Conf. 17: 1796-1798, Oct. 22, 2001.

International Search Report and the Written Opinion Dated Nov. 29, 2011 From the International Searching Authority Re. Application No. PCT/IB2010/055221.

Mikhitaryan et al. "Thick Film Contact Paste for Silicon Solar Cells With B-Doped Emitter", Proceedings of the 23rd European Photovoltaic Solar Energy Conference, Valencia, Spain, Sep. 1-5, 2008, XP007919734, p. 1364-1366, Sep. 2008.

Shibata "Photochemical Vapor-Deposited Silicon Oxynitride Films for Solar Cells", Electrons and Communications in Japan, Part II: Electronics, XP000331966, 75(7): 84-91, Jul. 1, 1992.

Kränzl et al. "Bifacial Solar Cells on Multi-Crystalline Silicon with Boron BSF and Open Rear Contact", IEEE 4th World Conference on Photovoltaic Energy Conversion, Hawaii, p. 1-4, 2006.

Official Action Dated Jan. 14, 2013 From the US Patent and Trademark Office Re. U.S. Appl. No. 12/591,390.

Official Action Dated Jan. 14, 2013 From the US Patent and Trademark Office Re. U.S. Appl. No. 12/591,391.

Restriction Official Action Dated Aug. 28, 2013 From the US Patent and Trademark Office Re. U.S. Appl. No. 12/947,842.

Restriction Official Action Dated May 1, 2012 From the US Patent and Trademark Office Re. U.S. Appl. No. 12/591,390.

International Preliminary Report on Patentability Dated May 31, 2012 From the International Bureau of WIPO Re. Application No. PCT/IB2010/055219.

Official Action Dated Jun. 11, 2012 From the US Patent and Trademark Office Re. U.S. Appl. No. 12/591,391.

Official Action Dated Jun. 14, 2012 From the US Patent and Trademark Office Re. U.S. Appl. No. 12/591,390.

Restriction Official Action Dated Apr. 24, 2012 From the US Patent and Trademark Office Re. U.S. Appl. No. 12/591,391.

Corrected Notice of Allowability Dated Sep. 16, 2013 From the US Patent and Trademark Office Re. U.S. Appl. No. 12/591,390.

* cited by examiner

METHOD OF MANUFACTURING PHOTOVOLTAIC CELLS, PHOTOVOLTAIC CELLS PRODUCED THEREBY AND USES THEREOF

RELATED APPLICATION

This application is a continuation-in-part of U.S. patent application Ser. Nos. 12/591,390 and 12/591,391 both filed on Nov. 18, 2009.

The contents of all of the above applications are incorporated by reference as if fully set forth herein.

FIELD AND BACKGROUND OF THE INVENTION

The present invention, in some embodiments thereof, relates to energy conversion, and, more particularly, but not exclusively, to a photovoltaic cell comprising a doped semiconductive substrate, and to methods of producing same.

Photovoltaic cells are capable of converting light directly into electricity. There is considerable hope that conversion of sunlight into electricity by photovoltaic cells will provide a significant source of renewable energy in the future, thereby enabling a reduction in the use of non-renewable sources of energy, such as fossil fuels. However, despite world-wide demand for environmentally friendly renewable energy sources, the high cost of manufacture of photovoltaic cells, as well as their limited efficiency of conversion of sunlight to electricity, has so far limited their use as a commercial source of electricity. There is therefore a strong demand for photovoltaic cells which are relatively inexpensive to produce, yet have a high efficiency.

Photovoltaic cells commonly comprise a p-type silicon substrate doped on one side thereof with an n-dopant (e.g., phosphorus) so as to form a $n^+$ layer, and doped on the other side thereof with a p-dopant (e.g., boron) so as to form a $p^+$ layer, thereby forming a $n^+$-p-$p^+$ structure. If an n-type silicon substrate is used, an $n^+$-n-$p^+$ structure is formed.

Electrical contacts are then applied to each side. Electrical contacts must cover only a small fraction of the surface area in order to avoid impeding the passage of light. Electrical contacts are typically applied in a grid pattern in order to avoid covering much of the surface area. Monofacial photovoltaic cells have such a grid pattern on one side of the photovoltaic cell, whereas bifacial photovoltaic cells have such a pattern on both sides of the photovoltaic cell, and can therefore collect light from any direction.

Efficiency may be improved by reducing reflectance of light from the surface of the photovoltaic cell. Methods for achieving this include texturing the surface and applying an antireflective coating.

In addition, attempts to improve efficiency include producing photovoltaic cells with a selective emitter, in which the $n^+$ layer is more heavily doped in regions underlying electrical contacts, in order to decrease contact resistance.

German Patent No. 102007036921 is illustrative of such an approach, disclosing a method of producing a solar cell with an $n^+$-p-$p^+$ structure, in which a masking layer having openings corresponding to the pattern of the contact grid is used while doping with phosphorus, so that the concentration of phosphorus will be highest under the contact grid.

U.S. Pat. No. 6,277,667 discloses a method of manufacturing a solar cell using screen printing to apply an n-dopant source to form $n^+$ regions, while a low dose n-dopant source is used to form shallowly doped $n^-$ regions. Electrodes are then screen-printed onto the $n^+$ regions.

U.S. Pat. No. 5,871,591 discloses diffusing phosphorus into a surface of a silicon substrate, metallizing a patterned grid onto the phosphorus-doped surface, and plasma etching the phosphorus-doped surface, such that the substrate below the electrical contacts is masked and material that is not masked is selectively removed.

Another approach to achieving an $n^+$ layer that is more heavily doped in regions underlying electrical contacts is the use of self-doping electrodes.

For example, U.S. Pat. No. 6,180,869 discloses a self-doping electrode to silicon formed primarily from a metal alloyed with a dopant. When the alloy is heated with a silicon substrate, dopant is incorporated into molten silicon.

Russian Patent No. 2139601 discloses a method of manufacturing a solar cell with an $n^+$-p-$p^+$ structure, by high-temperature processing of a silicon substrate with a borosilicate film applied to the back side thereof and a phosphosilicate film applied to the front side thereof. Removal of a layer of silicon from the front side of the substrate and texturing of the front side is then performed in one procedure. An $n^+$ layer is then formed on the front side, followed by formation of contacts.

Additional background art includes U.S. Pat. Nos. 6,825,104, 6,552,414, European Patent No. 1738402 and U.S. Pat. No. 4,989,059.

SUMMARY OF THE INVENTION

According to an aspect of some embodiments of the present invention there is provided a method of producing a photovoltaic cell, the method comprising:

a) doping a first surface of a semiconductive substrate with an n-dopant so as to form a first $n^+$ layer in the substrate;

b) doping a second surface of the substrate with a p-dopant so as to form a $p^+$ layer in the substrate;

c) removing a portion of the first $n^+$ layer from the first surface of the substrate, such that a concentration of the n-dopant remaining in the first surface of the substrate is variable throughout the first surface;

d) doping the first surface of the substrate with an n-dopant so as to form a second $n^+$ layer, such that a concentration of the n-dopant in the second $n^+$ layer is variable throughout the first surface; and e) forming electrical contacts on each of the first surface and the second surface, thereby producing the photovoltaic cell.

According to an aspect of some embodiments of the present invention there is provided a method of producing a photovoltaic cell, the method comprising:

a) applying a film comprising a p-dopant to a second surface of a semiconductive substrate;

b) removing the film comprising the p-dopant from a first surface of the substrate and from an edge of the substrate;

c) applying a film comprising an n-dopant to the first surface;

d) heating the substrate, so as to simultaneously form a first $n^+$ layer on the first surface and a $p^+$ layer on the second surface of the substrate;

e) removing a portion of the first $n^+$ layer from the first surface of the substrate, such that a concentration of the n-dopant remaining in the first surface of the substrate is variable throughout the first surface;

f) doping the first surface of the substrate with an n-dopant so as to form a second $n^+$ layer, such that a concentration of the n-dopant in the second $n^+$ layer is variable throughout the first surface; and g) forming electrical contacts on each of the first surface and the second surface, thereby producing the photovoltaic cell.

According to an aspect of some embodiments of the present invention there is provided a method of producing a photovoltaic cell, the method comprising:

a) applying a film comprising a p-dopant to a second surface of a semiconductive substrate;

b) removing the film comprising the p-dopant from a first surface of the substrate and from an edge of the substrate;

c) applying a film comprising an n-dopant to the first surface;

d) heating the substrate, so as to simultaneously form a first $n^+$ layer on the first surface and a $p^+$ layer on the second surface of the substrate;

e) removing at least a portion of the first $n^+$ layer; and f) forming electrical contacts on each of the first surface and the second surface, thereby producing the photovoltaic cell.

According to an aspect of some embodiments of the present invention there is provided a photovoltaic cell produced according to a method described herein.

According to an aspect of some embodiments of the present invention there is provided a photovoltaic cell comprising a semiconductive substrate, the substrate comprising an $n^+$ layer on a first surface thereof and a $p^+$ layer on a second surface thereof, the $n^+$ layer comprising an n-dopant and the $p^+$ layer comprising a p-dopant, and electrical contacts attached to each of the first surface and the second surface, wherein the first surface is textured so as to comprise peaks and troughs, and wherein a concentration of the n-dopant in the $n^+$ layer is greater in the peaks of the first surface than in the troughs of the first surface.

According to an aspect of some embodiments of the present invention there is provided a photovoltaic cell comprising a semiconductive substrate, the substrate comprising an $n^+$ layer on a first surface thereof and a $p^+$ layer on a second surface thereof, the $n^+$ layer comprising an n-dopant and the $p^+$ layer comprising a p-dopant, and electrical contacts attached to each of the first surface and the second surface, wherein the first surface is textured so as to comprise peaks and troughs, wherein a concentration of the n-dopant in the $n^+$ layer is greater in the peaks of the first surface than in the troughs of the first surface, wherein the $p^+$ layer and the $n^+$ layer do not contact one another, and wherein the $p^+$ layer does not reach an edge of the second surface.

According to an aspect of some embodiments of the present invention there is provided a photovoltaic cell comprising a semiconductive substrate, the substrate comprising an $n^+$ layer on a first surface thereof and a $p^+$ layer on a second surface thereof, the $n^+$ layer comprising an n-dopant and the $p^+$ layer comprising a p-dopant, and electrical contacts attached to each of the first surface and the second surface, wherein the $p^+$ layer and the $n^+$ layer do not contact one another, and wherein the $p^+$ layer does not reach an edge of the second surface.

According to an aspect of some embodiments of the present invention there is provided a photovoltaic array comprising a plurality of photovoltaic cells described herein, the plurality of photovoltaic cells being interconnected to one another.

According to an aspect of some embodiments of the present invention there is provided a power plant comprising a photovoltaic array described herein.

According to an aspect of some embodiments of the present invention there is provided an electric device comprising a photovoltaic cell described herein.

According to an aspect of some embodiments of the present invention there is provided a detector of electromagnetic radiation, the detector comprising a photovoltaic cell described herein, wherein the electromagnetic radiation is selected from the group consisting of ultraviolet, visible and infrared radiation.

According to some embodiments of the invention, the method further comprises forming a second $n^+$ layer on the first surface subsequent to removing the first $n^+$ layer and prior to forming the electrical contacts on the first surface.

According to some embodiments of the invention, the first $n^+$ layer is characterized by a sheet resistance of less than 30 ohms.

According to some embodiments of the invention, the first $n^+$ layer has a depth in a range of 0.4-2 µm.

According to some embodiments of the invention, the second $n^+$ layer is characterized by a sheet resistance in a range of 30-100 ohms.

According to some embodiments of the invention, the $n^+$ layer of the photovoltaic cell is characterized by a sheet resistance in a range of 30-100 ohms.

According to some embodiments of the invention, the second $n^+$ layer has a depth in a range of 0.2-0.7 µm.

According to some embodiments of the invention, the $n^+$ layer of the photovoltaic cell has a depth in a range of 0.2-0.7 µm.

According to some embodiments of the invention, removing the portion of the first $n^+$ layer from the first surface comprises texturing the first surface.

According to some embodiments of the invention, the texturing generates peaks and troughs in the first surface, wherein a concentration of the n-dopant remaining in the first surface following texturing is greater in the peaks than in the troughs.

According to some embodiments of the invention, a concentration of the n-dopant in the second $n^+$ layer is greater in the peaks than in the troughs.

According to some embodiments of the invention, a concentration of the n-dopant in the peaks in the second $n^+$ layer is at least twice a concentration of the n-dopant in the troughs in the second $n^+$ layer.

According to some embodiments of the invention, a concentration of the n-dopant in the peaks in the photovoltaic cell is at least twice a concentration of the n-dopant in the troughs in the photovoltaic cell.

According to some embodiments of the invention, a concentration of the n-dopant in the peaks in the second $n^+$ layer is at least $5 \times 10^{20}$ atoms/cm$^3$.

According to some embodiments of the invention, a concentration of the n-dopant in the peaks in the photovoltaic cell is at least $5 \times 10^{20}$ atoms/cm$^3$.

According to some embodiments of the invention, a concentration of the n-dopant in the troughs in the second $n^+$ layer is less than $10^{21}$ atoms/cm$^3$.

According to some embodiments of the invention, a concentration of the n-dopant in the troughs in the photovoltaic cell is less than $10^{21}$ atoms/cm$^3$.

According to some embodiments of the invention, removing the portion of the $n^+$ layer from the first surface comprises etching the first surface to an average depth in a range of from 4 µm to 12 µm.

According to some embodiments of the invention, etching is by an alkaline solution.

According to some embodiments of the invention, the first $n^+$ layer and the $p^+$ layer are formed simultaneously.

According to some embodiments of the invention, the doping with the n-dopant so as to form the first $n^+$ layer and the doping with the p-dopant so as to form the $p^+$ layer is effected by:

(i) applying a film comprising the p-dopant to the second surface;

(ii) applying a film comprising the n-dopant to the first surface; and (iii) heating the substrate, thereby simultaneously forming the first $n^+$ layer and the $p^+$ layer.

According to some embodiments of the invention, the film comprising the p-dopant and the film comprising the n-dopant each comprise silicon dioxide.

According to some embodiments of the invention, the film comprising the p-dopant comprises boron oxide.

According to some embodiments of the invention, the film comprising the n-dopant comprises phosphorus pentoxide.

According to some embodiments of the invention, the film comprising the n-dopant comprises at least 20 weight percents phosphorus pentoxide.

According to some embodiments of the invention, the film comprising the p-dopant and the film comprising the n-dopant are applied so as not to contact one another.

According to some embodiments of the invention, the removing of the film comprises washing the first surface of the substrate.

According to some embodiments of the invention, the washing comprises applying a solution on the substrate using a spin-on method.

According to some embodiments of the invention, the spin-on method uses a spin rate in a range of 400-4,500 rotations per minute.

According to some embodiments of the invention, the solution for the washing comprises water and isopropyl alcohol.

According to some embodiments of the invention, removing the film comprises removing the film from an area bordering an edge of the substrate, the area having a width in a range of 0.1-1 mm.

According to some embodiments of the invention, the $p^+$ layer of the photovoltaic cell does not cover an area bordering an edge of the substrate, the area having a width in a range of 0.1-1 mm.

According to some embodiments of the invention, the method further comprises applying an antireflective coating.

According to some embodiments of the invention, the photovoltaic cell further comprises an antireflective coating.

According to some embodiments of the invention, the antireflective coating is applied to the second surface subsequent to forming the $p^+$ layer and prior to forming the second $n^+$ layer.

According to some embodiments of the invention, the antireflective coating is applied to the first surface subsequent to forming the second $n^+$ layer.

According to some embodiments of the invention, the semiconductive substrate is an n-type semiconductor prior to forming the first $n^+$ layer and the $p^+$ layer.

According to some embodiments of the invention, the semiconductive substrate is a p-type semiconductor prior to forming the first $n^+$ layer and the $p^+$ layer.

According to some embodiments of the invention, the semiconductive substrate comprises silicon.

According to some embodiments of the invention, the n-dopant comprises phosphorus.

According to some embodiments of the invention, the p-dopant comprises boron.

According to some embodiments of the invention, the photovoltaic cell is characterized by a short circuit current density of at least 0.033 amperes/cm$^2$.

According to some embodiments of the invention, the photovoltaic cell is characterized by a fill factor of at least 75.5%.

According to some embodiments of the invention, the photovoltaic cell is characterized by an efficiency of at least 16.7%.

According to some embodiments of the invention, the photovoltaic cell is characterized by a specific shunt resistance of at least 4,750 ohm*cm$^2$, wherein the specific shunt resistance is determined for a photovoltaic cell having an area in a range of 150-160 cm$^2$ and a circumference in a range of 45-55 cm.

According to some embodiments of the invention, the photovoltaic cell is a bifacial photovoltaic cell.

According to some embodiments of the invention, the photovoltaic cell comprises an $n^+$-n-$p^+$ structure.

According to some embodiments of the invention, the photovoltaic cell comprises an $n^+$-p-$p^+$ structure.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

Figure 1:
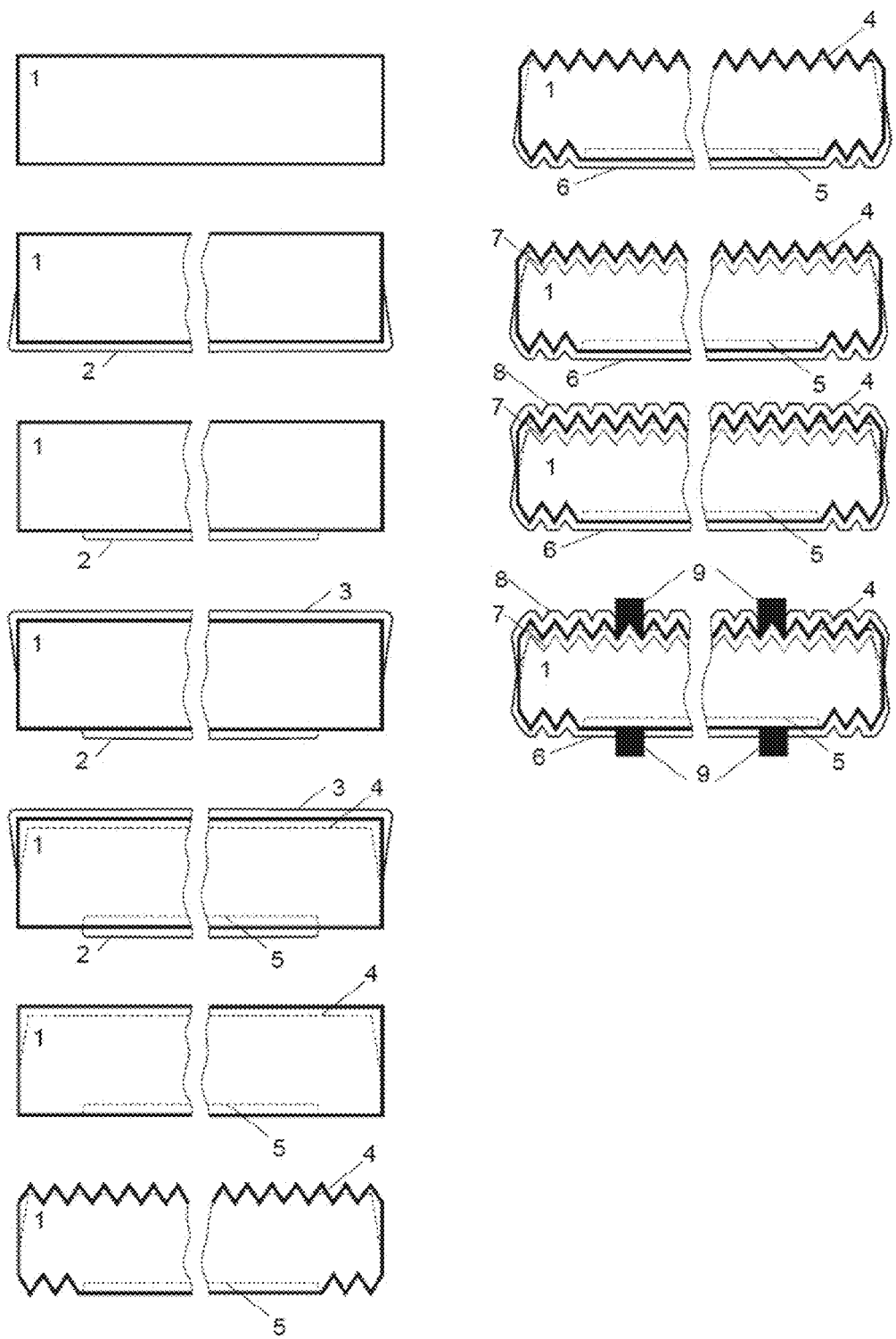
FIG. 1 is a scheme depicting an exemplary method for producing a photovoltaic cell according to some embodiments of the invention.

The present invention, in some embodiments thereof, relates to energy conversion, and, more particularly, but not exclusively, to a photovoltaic (PV) cell comprising a doped semi-conductive substrate, and to methods of producing same.

In a search for efficient, yet relatively inexpensive, photovoltaic cells for converting light energy to electrical energy, the present inventors have uncovered that a photovoltaic cell with an n-doped layer characterized by a variable concentration of an n-dopant exhibits improved efficiency.

In addition, the present inventors have conceived that when doping of a substrate to produce a photovoltaic cell is performed by applying a film comprising a p-dopant and a film comprising an n-dopant to opposite sides of a substrate, efficiency of the photovoltaic cell can be enhanced by introducing a simple, inexpensive procedure for removing the film comprising a dopant from portions of the substrate, in between the applications of the two films. Thus, a film comprising a p-dopant or an n-dopant is applied to one side of the substrate, the reverse side and the edge of the substrate are cleaned (e.g., by washing the reverse side with a solution), thereby removing the film from that side (if any is present) and from the edge of the substrate, and the other film is then applied on the cleaned side. This procedure significantly reduces contact between the two films. Consequently, overlap between the doped layers that are formed by these two films (the n⁺ layer and p⁺ layer) is reduced, and shunts which reduce the efficiency of the photovoltaic cell are thereby avoided. This procedure is superior to prior methods of reducing overlap, such as laser separation, which tends to be costly and to reduce the working area of the photovoltaic cell.

The present inventors have therefore devised and successfully practiced a novel methodology for producing a photovoltaic cell, which involves a reduced number of procedures in comparison with other methodologies, and is hence cost-efficient and yield-efficient, resulting in less defects during the manufacturing process. This novel methodology further results in photovoltaic cells with performance parameters that surpass many other PV cells.

While reducing the present invention to practice, the present inventors have produced a photovoltaic (PV) cell with an n⁺-p-p⁺ structure and a variable concentration of an n-dopant in the n⁺ layer, using a relatively simple, and hence relatively inexpensive, procedure. A first n⁺ layer is formed by doping and is then removed to a varying degree at different regions of the photovoltaic cell, such that the remaining n-dopant is present in a variable concentration. A second n⁺ layer is then formed by doping, and the concentration of n-dopant throughout the second n⁺ layer is variable, due to the variable nature of the removal of the first n⁺ layer.

Without being bound to any particular theory, it is believed that a variable concentration of an n-dopant in the n⁺ layer provides a combination of advantages of a high concentration of n-dopant and advantages of a low concentration of n-dopant. Thus, it is believed that the presence of randomly distributed local regions of a high concentration reduces series resistance of the photovoltaic cell, thereby increasing fill factor and efficiency of the photovoltaic cell, and that presence of regions of a low concentration increases efficiency by preventing the decrease in short circuit current which is characteristic of high dopant concentrations.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Referring now to the drawings, FIG. 1 illustrates an exemplary method for producing a photovoltaic cell according to some embodiments of the invention.

A semiconducting substrate 1 is coated on one side by a p-dopant-containing film 2. p-dopant-containing film 2 is removed from the edge of substrate 1. Substrate 1 is then coated with an n-dopant-containing film 3 on the side of the substrate opposite from p-dopant-containing film 2. Diffusion of dopants from the films is induced (e.g., by heating), thereby resulting in simultaneous formation of a first n⁺ layer 4 and a p⁺ layer 5. Films 2 and 3 are then removed. Substrate 1 is then textured at the surface thereof by an etching solution, resulting in peaks and troughs at the surface of the substrate (except at p⁺ layer 5, which resists texturing). First n⁺ layer 4 remains only at the peaks of the textured surface. Substrate 1 is then coated by a rear antireflection coating 6. A second n⁺ layer 7 is formed and then coated by a front antireflection coating 8. Rear antireflection coating 6 prevents second n⁺ layer 7 from contacting p⁺ layer 5. Electrical contacts 9 are then formed on both sides of the substrate, to form a photovoltaic cell.

Figure 2:
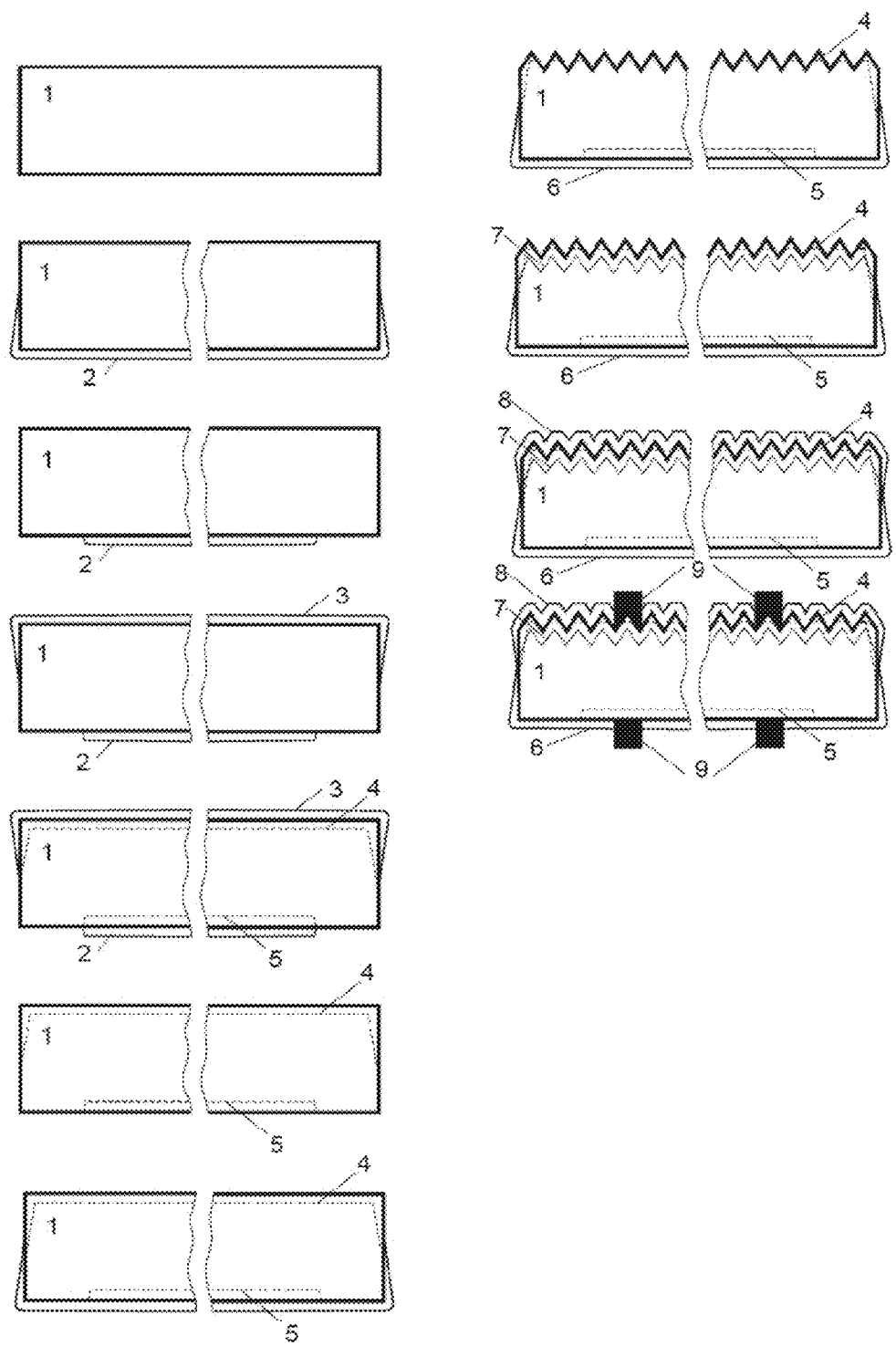
FIG. 2 is a scheme depicting another exemplary method for producing a photovoltaic cell according to some embodiments of the invention.

FIG. 2 illustrates another exemplary method for producing a photovoltaic cell according to some embodiments of the invention.

A semiconducting substrate 1 is coated on one side by a p-dopant-containing film 2. p-dopant-containing film 2 is removed from the edge of substrate 1. Substrate 1 is then coated with an n-dopant-containing film 3 on the side of the substrate opposite to p-dopant-containing film 2. Diffusion of dopants from the films is induced (e.g., by heating), thereby resulting in simultaneous formation of a first n⁺ layer 4 and a p⁺ layer 5. Films 2 and 3 are then removed. p⁺ layer 5 is then coated by a rear antireflection coating 6. Substrate 1 is then textured at the surface thereof by an etching solution, resulting in peaks and troughs at the surface of the substrate (except at rear antireflection coating 6, which resists texturing). First n⁺ layer 4 remains only at the peaks of the textured surface. A second n⁺ layer 7 is formed and then coated by a front antireflection coating 8. Rear antireflection coating 6 prevents second n⁺ layer 7 from contacting p⁺ layer 5. Electrical contacts 9 are then formed on both sides of the substrate, to form a photovoltaic cell.

The above-described exemplary methods achieve a variable concentration of n-dopant, as the concentration of n-dopant is higher at the peaks of the textured surface, where n-dopant originating from formation of the second n⁺ layer 7 is present along with n-dopant remaining from the first n⁺ layer 4.

The above-described exemplary methods also result in no overlap between the p⁺ layer and n⁺ layer, because the p⁺ layer does not reach the edge of the substrate as a result of the washing step, and further because the p⁺ layer is protected by the rear antireflection coating when the second n⁺ layer is formed.

In addition, the above methods are particularly advantageous in that they utilize procedures which improve efficiency of a photovoltaic cell by more than one mechanism.

Thus, texturing improves efficiency of photovoltaic cells both by reducing the percentage of light wasted by reflectance from the surface of the cell and by creating a variable concentration of n-dopant. Formation and removal of a first $n^+$ layer improves efficiency both by facilitating the creation of a variable concentration of n-dopant and by beneficially preventing formation of $p^+$ regions within the $n^+$ layer, which would detrimentally increase shunting. The rear antireflective coating both reduces reflectance and protects the $p^+$ layer when forming the second $n^+$ layer.

The above-described exemplary methods also form a non-symmetrical structure in which one side is textured and the other side is smooth. Without being bound by any particular theory, it is believed that such a structure is advantageous when radiation is incident on the textured surface, as the textured surface decreases reflection, and the smooth surface enhances internal reflection of long-wavelength radiation reaching the back of the cell, thereby increasing the contribution of long-wavelength radiation to the generated current. In addition, the effective surface recombination of the smooth $p^+$ surface is lower than that of a textured surface, resulting in lower losses of efficiency.

Thus, these methods do not require excessive procedures, and in fact involve less procedures than commonly utilized for producing PV cells, and none of the procedures included in these methods are particularly complex. As a result, the methods are relatively simple and inexpensive to perform. The reduced number of procedures reduces the chances of defects formation, thus render the entire process more efficient.

Figure 3:
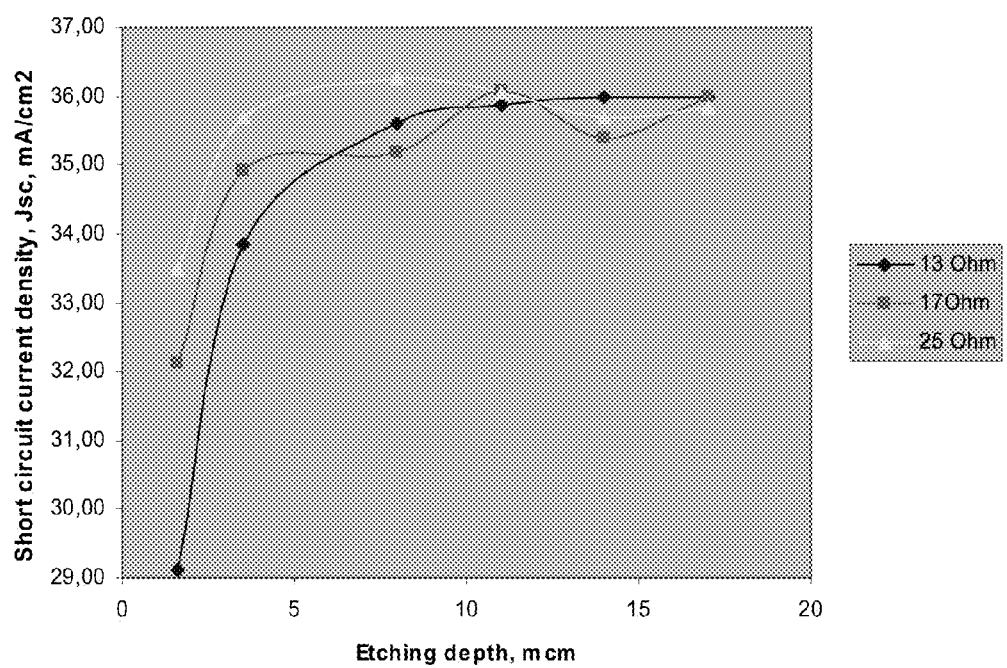
FIG. 3 is a graph showing the dependence of short circuit current ($I_{SC}$) on etching depth (in micrometers) in photovoltaic cells produced according to an embodiment of the invention, wherein the sheet resistance of the first $n^+$ layer of the cells was 13, 17 or 25 ohm.
Figure 4:
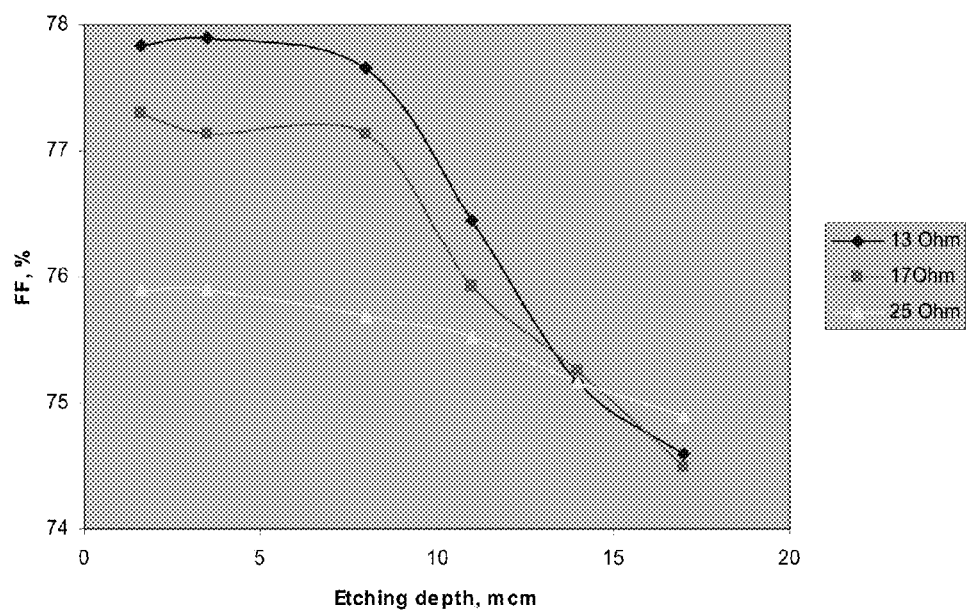
FIG. 4 is a is a graph showing the dependence of fill factor (FF) on etching depth (in micrometers) in photovoltaic cells produced according to an embodiment of the invention, wherein the sheet resistance of the first $n^+$ layer of the cells was 13, 17 or 25 ohm.
Figure 5:
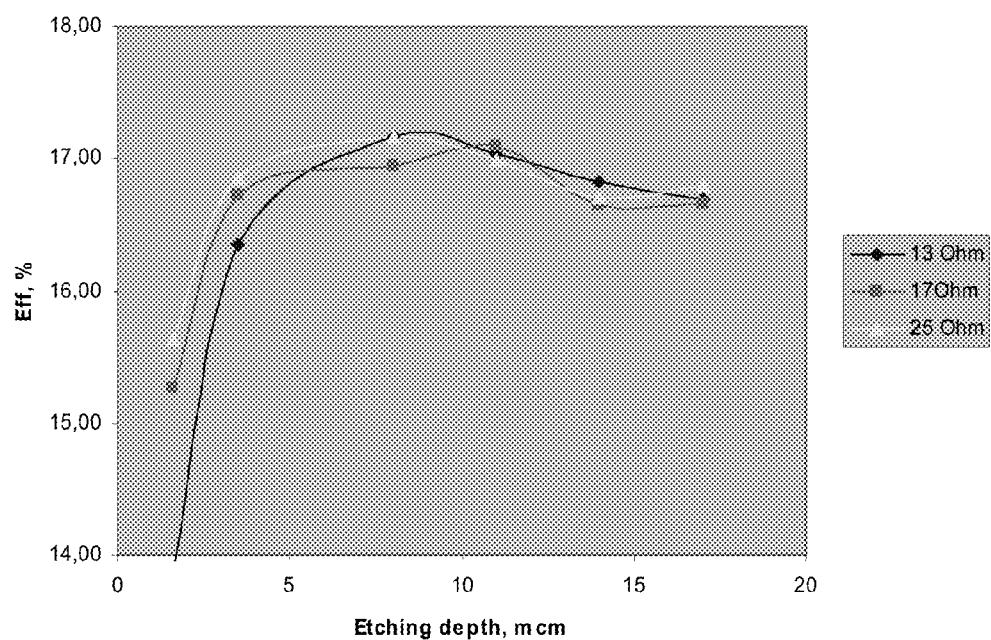
FIG. 5 is a is a graph showing the dependence of efficiency on etching depth (in micrometers) in photovoltaic cells produced according to an embodiment of the invention, wherein the sheet resistance of the first n⁺ layer of the cells was 13, 17 or 25 ohm.

FIG. 3 shows that the short circuit current density of photovoltaic cells prepared according to embodiments of the invention is reduced when etching during texturing is relatively shallow (e.g., less than about 4 µm on average). FIG. 4 shows that the fill factor of photovoltaic cells prepared according to methods described herein is reduced when etching during texturing is relatively deep (e.g., more than about 12 µm on average). FIG. 5 shows that the efficiency (which is correlated to both fill factor and short circuit current) of photovoltaic cells prepared according to methods described herein is greatest when etching is at an intermediate depth (e.g., about 4-12 µm on average).

Without being bound to any particular theory, it is believed that shallow texturing does not create the desired variable concentration of n-dopant because not enough of the n-dopant of the first $n^+$ layer is removed, while relatively deep etching does not create a variable concentration of n-dopant because virtually all of the n-dopant of the first $n^+$ layer is removed. Thus, it is believed that an intermediate average depth of etching is optimal for producing a variable concentration of n-dopant, as an intermediate average depth comprises both regions with relatively deep etching (troughs) and regions with relatively shallow etching (peaks).

Hence, according to an aspect of some embodiments of the invention, there is provided a method of producing a photovoltaic cell, the method comprising:

a) doping a first surface of a semiconductive substrate with an n-dopant so as to form a first $n^+$ layer in the substrate;

b) doping a second surface of the substrate with a p-dopant so as to form a $p^+$ layer in the substrate;

c) removing a portion of the first $n^+$ layer from the first surface of the substrate, such that a concentration of the n-dopant remaining in the first surface of the substrate is variable throughout the first surface;

d) doping the first surface of the substrate with an n-dopant so as to form a second $n^+$ layer, such that a concentration of the n-dopant in the second $n^+$ layer is variable throughout the first surface; and e) forming electrical contacts on each of the first surface and the second surface.

According to exemplary embodiments, the substrate is relatively thin and flat, such that the substrate has two surfaces on opposing sides which serve as the first and second surfaces described herein.

Silicon (e.g., silicon wafers) is an exemplary semiconductive substrate.

As is widely recognized in the art, "doping" is a process of impurity introduction in the semiconductor in which the number of free charge carriers in the doped semiconductor material can be increased, and as a result, elevation of the charge carrier density in the doped semiconductor material is effected. "p-Doping" refers to doping of a semiconductor with a substance ("dopant") which is capable of accepting weakly-bound outer electrons from the semiconductor material. Thus p-doping, wherein "p" denotes positive, is a process of doping a semiconductor with an acceptor material, or p-type dopant, which forms "holes", or positive charges, in the semiconductor. n-doping, wherein "n" denotes negative, is a process of doping a semiconductor with an electron donating material, or n-type dopant, which forms negative charges in the semiconductor.

As used herein, the term "dopant" refers to any element or compound, which when present in the semiconductive substrate, results in p-type or n-type conductivity. A dopant which results in p-type conductivity is referred to herein as a "p-dopant", and is typically an acceptor of electrons, whereas a dopant which results in n-type conductivity is referred to herein as a "n-dopant", and is typically a donor of electrons.

Boron is an exemplary p-dopant and phosphorus is an exemplary n-dopant. Optionally, arsenic is used as an n-dopant. Other p-dopants and n-dopants that are suitable for use in PV cells are also contemplated.

According to optional embodiments, the semiconductive substrate is an n-type semiconductor prior to the doping described hereinabove, which forms $n^+$ and $p^+$ layers. In such embodiments, the photovoltaic cell has an $n^+$-n-$p^+$ structure, with an n layer between the $n^+$ and $p^+$ layers. "$n^+$" denotes a layer with relatively strong doping with an n-dopant and "$p^+$" denotes a layer with relatively strong doping with a p-dopant, whereas "n" denotes a layer with weaker doping with an n-dopant.

According to alternative embodiments, the semi-conductive substrate is a p-type semiconductor prior to the doping described hereinabove, which forms $n^+$ and $p^+$ layers. In such embodiments, the photovoltaic cell has an $n^+$-p-$p^+$ structure, with a p layer between the $n^+$ and $p^+$ layers. "$n^+$" denotes a layer with relatively strong doping with an n-dopant and "$p^+$" denotes a layer with relatively strong doping with a p-dopant, whereas "p" denotes a layer with weaker doping with a p-dopant.

As used herein, the phrase "variable throughout the first surface" describes a surface in which the concentration of dopant in various regions on the surface differs from the concentration of dopant in other (e.g., adjacent) regions on the surface. The concentration of n-dopant at any location on the first surface may be determined by methods known in the art, for example, by sampling a thin slice of material from the surface of the substrate and determining its elemental composition. Optionally, secondary ion mass spectroscopy (SIMS) is used to determine the n-dopant concentration.

SIMS, a standard method of the art, is particularly suitable for determining local concentrations on a surface.

A further discussion of the variable concentrations of the dopant is provided hereinunder.

The electric contacts may be formed according to methods well known in the art. In order to allow light to reach the substrate of the photovoltaic cell, the contacts on at least one surface (e.g., the first surface) are configured so as to reach as much of the surface as possible while shading the surface as little as possible. For example, the contacts may optionally be configured in a grid pattern.

Optionally, the photovoltaic cell is monofacial, wherein the contacts on one surface are configured so as to allow light to pass through to the substrate, as described hereinabove, whereas the contacts on the other surface are not configured as such. For example, the surface may be completely covered by the electric contacts, as such a configuration provides ease of manufacture and high efficiency.

Alternatively, the photovoltaic cell is bifacial, wherein the contacts on both surfaces are configured so as to allow light to pass through to the substrate, thereby allowing the photovoltaic cell to produce electricity from illumination on either side of the cell.

According to some embodiments, the first $n^+$ layer has a depth in a range of 0.4-2 μm. Optionally, the depth is in a range of 0.6-1.2 μm.

According to some embodiments, the first $n^+$ layer is characterized by a sheet resistance of less than 30 ohm. Optionally, the sheet resistance is less than 25 ohms, optionally less than 20 ohm, and optionally less than 15 ohm. According to exemplary embodiments, the sheet resistance is in a range of between about 13 ohms to about 25 ohms.

It is to be noted that the sheet resistance of an $n^+$ layer is inversely correlated to the concentration of n-dopant. The relatively low sheet resistance of the first $n^+$ layer described herein thus corresponds to a relatively high concentration of n-dopant, which can decrease the short circuit current and efficiency of a photovoltaic cell.

Thus, in exemplary embodiments, the second $n^+$ layer, which replaces the first $n^+$ layer, is characterized by a higher sheet resistance than the relatively low sheet resistances described hereinabove for the first $n^+$ layer.

According to some embodiments, the second $n^+$ layer is characterized by a sheet resistance in a range of 30-100 ohms. Optionally, the sheet resistance is in a range of 40-65 ohms. According to an exemplary embodiment, the sheet resistance is about 55 ohms.

According to some embodiments, the second $n^+$ layer has a depth in a range of 0.2-0.7 μm, and optionally in a range of 0.3-0.4 μm.

According to exemplary embodiments, removing of the portion of the first $n^+$ layer from the first surface comprises texturing the first surface.

As used herein, the term "texturing" means to make a surface more rough (e.g., resulting in peaks and troughs on the surface).

As used herein, the term "peak" refers to a region of the surface which is higher than adjacent regions, whereas the term "trough" refers to a region of the surface which is lower than adjacent regions.

According to some embodiments, the texturing generates peaks and troughs in the first surface, wherein a concentration of the n-dopant remaining in the first surface following texturing is greater in the peaks than in the troughs. Accordingly, the variable concentration of the dopant throughout the surface is manifested in these embodiments by the different concentration of the dopant in the peaks and troughs. Thus, the concentration of n-dopant in the peaks will represent local maxima of the concentration on the surface of the substrate, whereas the concentration of n-dopant in the troughs will represent local minima. These maxima and minima of the concentration create a variable concentration.

According to some embodiments, the concentration of the n-dopant in the second $n^+$ layer is greater in the peaks than in the troughs. Optionally, the concentration of the n-dopant in the peaks is at least twice a concentration of the n-dopant in the troughs. Optionally, the concentration of the n-dopant in the peaks is at least 3 times, optionally at least 5 times, and optionally at least 10 times a concentration of the n-dopant in the troughs.

According to some embodiments, a concentration of the n-dopant in the peaks in the second $n^+$ layer is at least $5 \times 10^{20}$ atoms/cm$^3$. Optionally, the concentration is at least $10^{21}$ atoms/cm$^3$, optionally at least $2 \times 10^{21}$ atoms/cm$^3$, optionally at least $3 \times 10^{21}$ atoms/cm$^3$, and optionally at least $5 \times 10^{21}$ atoms/cm$^3$.

According to some embodiments, a concentration of the n-dopant in the troughs in the second $n^+$ layer is less than $10^{21}$ atoms/cm$^3$. Optionally, the concentration is less than $0.5 \times 10^{21}$ atoms/cm$^3$, optionally less than $0.3 \times 10^{21}$ atoms/cm$^3$, optionally less than $0.2 \times 10^{21}$ atoms/cm$^3$, and optionally less than $10^{20}$ atoms/cm$^3$.

It is to be appreciated that a "high" concentration of n-dopant in the peaks of some embodiments with a greater concentration of n-dopant in the peaks than in the troughs thereof may be somewhat lower than a "low" concentration in the troughs of another embodiment with a greater concentration of n-dopant in the peaks than in the troughs thereof. According to some embodiments, removing the portion of the first $n^+$ layer from the first surface comprises etching the first surface to an average depth in a range of from 4 μm to 12 μm. Optionally, the depth is in a range of 6 μm to 10 μm.

According to some embodiments, the etching is effected by an alkaline solution (e.g., a solution that comprises sodium hydroxide).

In each of the methods described herein, the first $n^+$ layer and the $p^+$ layer are formed via any of the methods known in the art.

In some embodiments, whenever an $n^+$ layer is deposited without forming variable concentrations of the dopant throughout the surface, applying a film comprising an n-dopant to the first surface can alternatively be effected by any method known in the art. According to some embodiments, the first $n^+$ layer and the $p^+$ layer are formed simultaneously (e.g., by heating).

According to exemplary embodiments, the doping with the n-dopant so as to form the first $n^+$ layer and the doping with the p-dopant so as to form the $p^+$ layer is effected by applying a film comprising the p-dopant to the second surface, applying a film comprising the n-dopant to the first surface, and heating the substrate, thereby simultaneously forming the first $n^+$ layer and the $p^+$ layer.

According to some embodiments, the film comprising the p-dopant and the film comprising the n-dopant each comprise silicon dioxide. Silicon dioxide-based films may be selectively removed following the doping procedure by hydrofluoric acid.

According to some embodiments, the film comprising the p-dopant comprises boron oxide.

According to some embodiments, the film comprising the n-dopant comprises phosphorus pentoxide ($P_2O_5$). Optionally, the film comprises at least 20 weight percents $P_2O_5$. As exemplified hereinbelow in the Examples section, the concentration of phosphorus in the first $n^+$ layer and the sheet resistance of the first $n^+$ layer may be readily controlled by selecting a suitable concentration of $P_2O_5$ in the doping film.

In some embodiments, the film comprising the p-dopant and the film comprising the n-dopant are applied so as not to contact one another, thus resulting in reduced shunting.

This is optionally effected by removing the film comprising the p-dopant from a first surface of the substrate and from an edge of the substrate.

It is to be appreciated that even in embodiments wherein the film comprising the p-dopant is not applied to the first surface and/or an edge, minute quantities of the film may inadvertently be present thereon. Such minute quantities may be considerably detrimental to the performance of a photovoltaic cell, by creating shunting.

Thus, it is to be understood that "removing the film" refers to any procedure capable of removing any film which may be present, and does not require demonstrating that film is indeed present.

According to some embodiments, the film is removed from an area of the second surface bordering an edge of the substrate. Optionally, such an area has an average width in a range of 0.1-1 mm. Thus, a film-free band (e.g., a 0.1-1 mm wide band) is formed around the perimeter of the second surface of the substrate. Such a film-free band further reduces the likelihood of overlap between p-dopant and n-dopant, thereby reducing shunting.

Optionally, removing the film is effected by washing the first surface of the substrate with a solution. The washing may be performed such that film is simultaneously removed from both the first surface and from an edge of the substrate, and optionally also from an area of the second surface which borders an edge.

According to some embodiments, the washing comprises applying a washing solution on the substrate using a spin-on method. Optionally, the spin-on method uses a spin rate in a range of 400-4,500 rotations per minute (rpm), and optionally in a range of 600-3,000 rpm. As exemplified hereinbelow in the Examples section, the spin-on method simultaneously removes film from both the edge of the substrate and from the perimeter of the second surface, in addition to the first surface.

An exemplary solution for washing comprises water and isopropyl alcohol.

In some embodiments, removing the film is effected via other methods known in art.

As exemplified hereinbelow, the present inventors have surprisingly found that the above-described procedure for removing a p-dopant-containing film, while being simple, convenient and inexpensive, provides photovoltaic cell performance which is at least as efficient as the performance obtained using more costly and technically complex standard methods for separating $p^+$ and $n^+$ layers (e.g., laser separation, plasma etching).

Thus, the procedure described herein for removing a p-dopant-containing film is applicable for improving performance of a wide variety of photovoltaic cell types.

Hence, according to another aspect of embodiments of the present invention, there is provided a method of producing a photovoltaic cell, the method comprising:

a) applying a film comprising a p-dopant (e.g., boron) to a second surface of a semiconductive substrate (e.g., silicon);

b) removing the film comprising the p-dopant from a first surface of the substrate and from an edge of the substrate (e.g., by washing the first surface with a liquid);

c) applying a film comprising an n-dopant (e.g., phosphorus, arsenic) to the first surface;

d) heating the substrate, so as to simultaneously form a first $n^+$ layer on the first surface and a $p^+$ layer on the second surface of the substrate;

e) removing at least a portion of the first $n^+$ layer; and f) forming electrical contacts on each of the first surface and the second surface, thereby producing the photovoltaic cell.

Without being bound by any particular theory, it is believed that formation of a first $n^+$ layer simultaneously with the formation of the $p^+$ layer advantageously prevents formation of $p^+$ regions within the $n^+$ layer, which would detrimentally increase shunting. However, a concentration and depth of n-dopant which is particularly suitable for preventing formation of deleterious $p^+$ regions may be higher than a concentration and depth of n-dopant which is particularly suitable for optimal performance of the final product. Hence, it is believed that by removing at least a portion of the first $n^+$ layer, the n-dopant concentration in the $n^+$ layer is reduced to a more suitable level for a photovoltaic cell.

In some embodiments, the method further comprises forming a second $n^+$ layer on the first surface subsequent to removing the first $n^+$ layer and prior to forming the electrical contacts on the first surface. Removing all or nearly all of the first $n^+$ layer and subsequently forming a second $n^+$ layer with the desired properties may be less difficult and more reliable than removing only a portion of the first $n^+$ layer. However, in some embodiments, no formation of a second $n^+$ layer is performed. In such embodiments, the removal of the first $n^+$ layer is optionally performed to a depth that is correlated to the $n^+$ layer thickness and doping profile so as to generate both regions (e.g., peaks) with high n-dopant concentrations and regions (e.g., troughs) with low n-dopant concentrations, as described herein.

The dopant-containing films, applications thereof, removal of the film containing the p-dopant (e.g., washing procedure), and properties (e.g., depth, sheet resistance) of the final $n^+$ layer (e.g., the second $n^+$ layer) are optionally as described hereinabove.

According to exemplary embodiments of the present invention, the above-described novel procedure of removing an applied p-dopant-containing film from the first surface and from an edge is combined with the above-described novel formation of a variable concentration of n-dopant on the first surface.

Thus, according to an aspect of embodiments of the present invention, there is provided a method of producing a photovoltaic cell, the method comprising:

a) applying a film comprising a p-dopant to a second surface of a semiconductive substrate;

b) removing the film comprising the p-dopant from a first surface of the substrate and from an edge of the substrate (e.g., by washing the first surface with a liquid);

c) applying a film comprising an n-dopant to the first surface;

d) heating the substrate, so as to simultaneously form a first $n^+$ layer on the first surface and a $p^+$ layer on the second surface of the substrate;

e) removing a portion of the first $n^+$ layer from the first surface of the substrate, such that a concentration of the n-dopant remaining in the first surface of the substrate is variable throughout the first surface;

f) doping the first surface of the substrate with an n-dopant so as to form a second $n^+$ layer, such that a concentration of the n-dopant in the second $n^+$ layer is variable throughout the first surface; and g) forming electrical contacts on each of the first surface and the second surface, thereby producing the photovoltaic cell.

According to another aspect of embodiments of the present invention, there is provided a photovoltaic cell produced according to any of the methods described herein.

Thus, according to some embodiments, there is provided a photovoltaic cell comprising a semiconductive substrate, the substrate comprising an $n^+$ layer on a first surface thereof and a $p^+$ layer on a second surface thereof, and electrical contacts attached to each of the first surface and the second surface, wherein the first surface is textured so as to comprise peaks and troughs, and wherein a concentration of the n-dopant in the $n^+$ layer is greater in the peaks of the first surface than in the troughs of the first surface.

According to some embodiments, there is provided a photovoltaic cell comprising a semiconductive substrate, the substrate comprising an $n^+$ layer on a first surface thereof and a $p^+$ layer on a second surface thereof, and electrical contacts attached to each of the first surface and the second surface, wherein the $p^+$ layer and the $n^+$ layer do not contact one another, and wherein the $p^+$ layer does not reach an edge of the second surface.

According to some embodiments, there is provided a photovoltaic cell comprising a semiconductive substrate, the substrate comprising an $n^+$ layer on a first surface thereof and a $p^+$ layer on a second surface thereof, and electrical contacts attached to each of the first surface and the second surface, wherein the first surface is textured so as to comprise peaks and troughs, wherein a concentration of the n-dopant in the $n^+$ layer is greater in the peaks of the first surface than in the troughs of the surface, wherein the $p^+$ layer and the $n^+$ layer do not contact one another, and wherein the $p^+$ layer does not reach an edge of the second surface.

It is to be appreciated that the "$n^+$ layer" of the photovoltaic cells described herein corresponds to the "second $n^+$ layer" which is discussed herein in the context of the methods described herein. Thus, the $n^+$ layer of the photovoltaic cells may optionally be characterized by any of the features (e.g., depth, sheet resistance, local n-dopant concentration) described herein with respect to the second $n^+$ layer.

Optionally, the photovoltaic cell is a bifacial photovoltaic cell.

The substrate optionally comprises silicon, the p-dopant optionally comprises boron, and the n-dopant is optionally selected from the group consisting of phosphorus and arsenic, wherein phosphorus is an exemplary n-dopant.

According to some embodiments, the fill factor of the photovoltaic cell is at least 75.5%, optionally at least 76%, optionally at least 76.5%, and optionally at least 77%.

According to some embodiments, the efficiency of the photovoltaic cell is at least 16.7%, optionally at least 16.8%, optionally, at least 16.9% and optionally at least 17%.

According to some embodiments, the short circuit current density of the photovoltaic cell is at least 0.033 amperes/cm$^2$, optionally at least 0.0335 amperes/cm$^2$, and optionally at least 0.034 amperes/cm$^2$.

According to some embodiments, the specific shunt resistance of the photovoltaic cell is at least 4,750 ohm*cm$^2$ (i.e., ohm multiplied by cm$^2$), optionally at least 5,500 ohm*cm$^2$, and optionally at least 6,250 ohm*cm$^2$. As specific shunt resistance may depend on the area and shape of a photovoltaic cell, the aforementioned specific shunt resistance may be determined for a photovoltaic cell having an area in a range of 150-160 cm$^2$ and being substantially square (i.e., having a circumference in a range of 45-55 cm).

The abovementioned physical parameters are determined by measurements at standard test conditions used in the art to evaluate photovoltaic cells. Standard test conditions include solar irradiance of 1,000 W/m$^2$, solar reference spectrum AM (airmass) of 1.5 and a cell temperature 25° C.

Short circuit current density may be determined, for example, by measuring the current ($I_{SC}$) produced by the photovoltaic cell at short circuit (i.e., voltage=0) using standard techniques of the art. Open circuit voltage ($V_{OC}$) may be determined by measuring the voltage across the photovoltaic cell at open circuit (i.e., current=0) using standard techniques.

Fill factor and efficiency may be determined by measuring the maximal power output of the photovoltaic cell.

Thus, the fill factor is defined as the ratio between the maximal power and the product of short circuit current and open circuit voltage ($I_{SC} \times V_{OC}$). The maximal power, $I_{SC}$ and $V_{OC}$ are determined as described hereinabove.

Specific shunt resistance may be determined, for example, by measuring the current produced by the photovoltaic cell at various operating voltages, so as to obtain data describing the current as a function of operating voltage, and obtaining the shunt resistance from such data via non-linear regression, using techniques known in the art. The shunt resistance can then be multiplied by the area of the photovoltaic cell to obtain the specific shunt resistance. In order to assay photovoltaic cells with an area in a range of 150-160 cm$^2$ and being substantially square, larger photovoltaic cells can be cut to the appropriate area and shape. The efficiency may be determined by determining the maximal power as described hereinabove, and dividing by the input light irradiance of the standard test conditions.

It is to be appreciated that embodiments of the present invention do not necessarily result in increased short circuit current density. Rather, as exemplified hereinbelow in the Examples section, it is the combination of a moderately high short circuit current density with an increased fill factor which results in the high efficiencies of photovoltaic cells according to embodiments of the present invention.

Without being bound by any particular theory, it is believed that embodiments of the methods and photovoltaic cells described herein in which a p-dopant-containing film is removed from the first surface and from an edge of the substrate are particularly suitable for obtaining an increased specific shunt resistance, and consequently an increased fill factor and efficiency.

According to some embodiments, the $p^+$ layer of the photovoltaic cell does not cover an area bordering an edge of the substrate thereof, the area having a width in a range of 0.1-1 mm.

According to some embodiments of each of the aspects described herein, an antireflective coating is applied onto the substrate of the photovoltaic cell. Various antireflective coatings will be familiar to one of ordinary skill in the art.

The antireflective coating may be applied in more than one step. For example, according to exemplary embodiments, an antireflective coating is applied to the second surface in one step, and applied to the first surface in another step. Optionally, an antireflective coating applied to one surface is of a different composition than an antireflective coating applied to another surface.

According to some embodiments, the antireflective coating is applied to the second surface subsequent to forming the $p^+$ layer and prior to forming the second $n^+$ layer. As discussed hereinabove, such an application of an antireflective coating may be useful in preventing overlap between the $p^+$ layer and the second $n^+$ layer, provided that the antireflective coating is at least somewhat resistant to diffusion of the n-dopant.

According to some embodiments, the antireflective coating is applied to the first surface subsequent to forming the second $n^+$ layer.

According to another aspect of embodiments of the invention, there is provided a photovoltaic array comprising a plurality of any of the photovoltaic cells described herein, the photovoltaic cells being interconnected to one another.

As used herein, the phrase "photovoltaic array" describes an array of photovoltaic cells which are interconnected in series and/or in parallel. Connection of the cells in series creates an additive voltage. Connection of the cells in parallel results in a higher current. Thus, a skilled artisan can connect the cells in a manner which will provide a desired voltage and current.

The array may optionally further combine additional elements such as a sheet of glass to protect the photovoltaic cell from the environment without blocking light from reaching the photovoltaic cell and/or a base which orients the array in the direction of a source of light (e.g., for tracking the daily movement of the sun). Optionally, an inverter is present in order to convert the current to alternating current. A battery is optionally present in order to store energy generated by the photovoltaic cell.

According to another aspect of embodiments of the present invention, there is provided a power plant comprising the photovoltaic array described herein. The power plant optionally comprises a plurality of photovoltaic arrays positioned so as to maximize their exposure to sunlight.

It is to be appreciated that an optimal position and orientation of a photovoltaic array may depend on whether the photovoltaic cells therein are bifacial or monofacial.

According to another aspect of embodiments of the present invention, there is provided an electric device comprising the photovoltaic cell of claim 34. In some embodiments, the photovoltaic cells are a power source for the electric device.

Exemplary applications of the photovoltaic cells and/or the solar arrays described herein include, but are not limited to, a home power source, a hot water heater, a pocket computer, a notebook computer, a portable charging dock, a cellular phone, a pager, a PDA, a digital camera, a smoke detector, a GPS device, a toy, a computer peripheral device, a satellite, a space craft, a portable electric appliance (e.g., a portable TV, a portable lighting device), and a cordless electric appliance (e.g., a cordless vacuum cleaner, a cordless drill and a cordless saw).

According to another aspect of embodiments of the present invention, there is provided a detector of electromagnetic radiation, the detector comprising any photovoltaic cell described herein, wherein the electromagnetic radiation is selected from the group consisting of ultraviolet, visible and infrared radiation. The detector may be used, for example, in order to detect the radiation (e.g., as an infrared detector) and/or to measure the amount of radiation (e.g., in spectrophotometry).

It is expected that during the life of a patent maturing from this application many relevant doping techniques will be developed and the scope of the term "doping" is intended to include all such new technologies a priori.

As used herein the term "about" refers to ±10% The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical and physical arts.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

p-Type monocrystalline silicon pseudosquare substrates (125×125 mm) with a resistivity of 1.6 ohm were used. The crystal orientation of the substrate surface was [100]. Saw damage was removed by means of etching in a solution of 25% sodium hydroxide. The substrates were then washed in peroxide-ammoniac solution.

A film of silicon dioxide containing 50% (by weight) of boron oxide was applied to the back side of the substrates employing a spin-on method using a spin rate of 3,000 rpm. A solution of 50% water and 50% isopropyl alcohol was applied to the front side of the substrates employing a spin-on method using a spin rate of 1,200 rpm for 4 seconds. As a result of the application of water/isopropyl alcohol, borosilicate glass was removed from a narrow strip (approximately 0.6 mm wide) along the edge of the back side. The spin rate was then increased to 3,000 rpm, resulting in complete drying of the substrates.

The substrates were divided into 3 experimental groups of 60 substrates. Films of silicon dioxide containing 20%, 25% or 30% (by weight) $P_2O_5$ were applied to the front surface of the substrates employing the spin-on method. A clean break between the films of borosilicate and phosphosilicate glass was observed along the edge of the back side (i.e, the two films did not come into contact).

Diffusion of dopants into the substrate was performed by heating for 20 minutes at a temperature of 1010° C. under a nitrogen atmosphere. The resulting $p^+$ layer on the back side had sheet resistance of 25 ohm or less and a depth of approximately 1 μm. The resulting $n^+$ layer on the front side exhibited sheet resistances of 25, 17 and 13 ohm when phosphosilicate films of 20%, 25% and 30%, respectively, of $P_2O_5$ were used.

Sheet resistances were determined using a four probe method. The depths of the $n^+$ layers were determined by measuring sheet resistance and subsequently removing thin layers of the substrate by etching.

The oxide layers were then removed by a 10% solution of hydrofluoric acid. Simultaneous texturing of the front side of the substrate and removal of the $n^+$ layer was performed by etching with an aqueous solution of 2% sodium hydroxide and 4% isopropyl alcohol at 80° C. Etching was performed for 5, 10, 15, 25, 30 or 35 minutes. The substrates were weighed before and after etching. The average depth of etching was determined according to a difference in weight before and after texturing. In all groups, a textured ring along the edge of the back (boron-doped) side was clearly visible after texturing. As the boron-doped areas resisted texturing, this ring confirmed that the boron-doped area did not extend to the edge of the substrate.

An antireflective layer of titanium dioxide was then applied on the boron-doped surface using an atmospheric pressure chemical vapor deposition (CVD) method.

A second diffusion of phosphorus into the substrate was performed by applying a film of phosphosilicate glass containing 50% $P_2O_5$, and heating at a temperature of 850° C. for 20 minutes. The resulting $n^+$ layer exhibited a sheet resistance of 55 ohm, and had a depth of approximately 0.35 μm. Phosphorus surface concentration was determined as described above.

The film of phosphosilicate glass was removed by a 10% solution of hydrofluoric acid. The titanium dioxide film was resistant to the hydrofluoric acid solution. An antireflective layer of silicon nitride was then applied to the front surface.

A contact pattern was applied to the both sides of the substrate employing a screen printed process. PV-156 paste (DuPont) was used for the front contact; a paste developed by Monokristal (Stavropol, Russia) was used for the back contact. Firing was performed in a Centrotherm furnace.

After the contacts were formed, the parameters of solar cell performance were measured. Laser p-n junction separation was then performed at a distance of 0.2 mm from the edge of the substrate. The parameters were then measured again. The results of the measurements are presented in Tables 1-3 hereinbelow. The dependence of various parameters (before laser separation) on average etching depth during texturing is depicted graphically in FIGS. 3-5.

TABLE 1

Mean values for solar cells prepared using 30% $P_2O_5$ film
Sheet resistance of initial $n^+$ layer = 13 ohm

| Etching depth (μm) | Short circuit current ($I_{SC}$) (amperes) | Open circuit voltage ($V_{OC}$) (mV) | Fill factor (FF) (%) | Efficiency (%) | Shunt resistance ($R_{SH}$) (Ohm) |
|---|---|---|---|---|---|
| Before Laser Separation | | | | | |
| 1.6 | 4.326 | 612 | 77.83 | 13.87 | 28 |
| 3.5 | 5.030 | 620 | 77.9 | 16.35 | 43 |
| 8 | 5.292 | 621 | 77.66 | 17.17 | 38 |
| 11 | 5.332 | 621 | 76.45 | 17.03 | 42 |
| 14 | 5.346 | 622 | 75.16 | 16.82 | 54 |
| 17 | 5.346 | 622 | 74.6 | 16.69 | 38 |
| After Laser Separation | | | | | |
| 1.6 | 4.293 | 611 | 77.81 | 13.74 | 30 |
| 3.5 | 4.992 | 618 | 77.82 | 16.16 | 39 |
| 8 | 5.252 | 619 | 77.63 | 16.98 | 42 |
| 11 | 5.292 | 620 | 76.28 | 16.84 | 37 |
| 14 | 5.306 | 620 | 74.92 | 16.59 | 39 |
| 17 | 5.306 | 621 | 74.56 | 16.53 | 36 |

TABLE 2

Mean values for solar cells prepared using 25% $P_2O_5$ film
Sheet resistance of initial $n^+$ layer = 17 ohm

| Etching depth (μm) | Short circuit current ($I_{SC}$) (amperes) | Open circuit voltage ($V_{OC}$) (mV) | Fill factor (FF) (%) | Efficiency (%) | Shunt resistance ($R_{SH}$) (Ohm) |
|---|---|---|---|---|---|
| Before Laser Separation | | | | | |
| 1.6 | 4.771 | 615 | 77.31 | 15.26 | 40 |
| 3.5 | 5.188 | 621 | 77.13 | 16.72 | 37 |
| 8 | 5.230 | 624 | 77.14 | 16.94 | 52 |
| 11 | 5.362 | 624 | 75.92 | 17.09 | 32 |
| 14 | 5.260 | 625 | 75.26 | 16.65 | 41 |
| 17 | 5.346 | 622 | 74.49 | 16.67 | 37 |
| After Laser Separation | | | | | |
| 1.6 | 4.735 | 614 | 77.32 | 15.13 | 34 |
| 3.5 | 5.149 | 620 | 77.15 | 16.57 | 40 |
| 8 | 5.190 | 622 | 77.12 | 16.75 | 48 |
| 11 | 5.322 | 623 | 75.94 | 16.94 | 31 |
| 14 | 5.220 | 623 | 75.21 | 16.46 | 43 |
| 17 | 5.306 | 621 | 74.42 | 16.50 | 31 |

TABLE 3

Mean values for solar cells prepared using 20% $P_2O_5$ film
Sheet resistance of initial $n^+$ layer = 25 ohm

| Etching depth (μm) | Short circuit current ($I_{SC}$) (amperes) | Open circuit voltage ($V_{OC}$) (mV) | Fill factor (FF) (%) | Efficiency (%) | Shunt resistance ($R_{SH}$) (Ohm) |
|---|---|---|---|---|---|
| Before Laser Separation | | | | | |
| 1.6 | 4.978 | 615 | 75.9 | 15.64 | 30 |
| 3.5 | 5.303 | 622 | 75.9 | 16.85 | 37 |
| 8 | 5.386 | 626 | 75.68 | 17.17 | 44 |

TABLE 3-continued

Mean values for solar cells prepared using 20% $P_2O_5$ film
Sheet resistance of initial $n^+$ layer = 25 ohm

| Etching depth (μm) | Short circuit current ($I_{SC}$) (amperes) | Open circuit voltage ($V_{OC}$) (mV) | Fill factor (FF) (%) | Efficiency (%) | Shunt resistance ($R_{SH}$) (Ohm) |
|---|---|---|---|---|---|
| 11 | 5.356 | 624 | 75.52 | 16.99 | 39 |
| 14 | 5.303 | 623 | 75.16 | 16.71 | 50 |
| 17 | 5.326 | 626 | 74.89 | 16.80 | 42 |
| After Laser Separation | | | | | |
| 1.6 | 4.941 | 614 | 75.89 | 15.49 | 33 |
| 3.5 | 5.263 | 621 | 75.9 | 16.69 | 39 |
| 8 | 5.346 | 625 | 75.66 | 17.01 | 42 |
| 11 | 5.316 | 624 | 75.51 | 16.86 | 38 |
| 14 | 5.263 | 623 | 75.06 | 16.56 | 50 |
| 17 | 5.286 | 625 | 74.87 | 16.65 | 39 |

For several of the samples prepared, determination of phosphorus surface concentration after both the first and second diffusion of phosphorus (i.e., in both the first $n^+$ layer and the second $n^+$ layer) was performed using SIMS (secondary ion mass spectrometry). Based on these measurements, the concentration of phosphorus in both the peaks and in the troughs of the photovoltaic cells was estimated. The expected concentration in the troughs was the concentration measured after the second diffusion of phosphorus, whereas the expected concentration in the peaks was the sum of phosphorus concentrations measured after the first and second diffusions. The results are summarized in Table 4.

TABLE 4

Mean values for phosphorous surface concentrations
and expected concentrations for peaks and troughs.

| | Initial sheet resistance (Ohm) | | |
|---|---|---|---|
| | 13 | 17 | 25 |
| Surface concentration of phosphorus after first diffusion (atoms/cm$^3$) | ~8 × 10$^{20}$ | ~5 × 10$^{20}$ | ~3 × 10$^{20}$ |
| Surface concentration of phosphorus after second diffusion (atoms/cm$^3$) | | ~3 × 10$^{20}$ | |
| Expected concentration of phosphorus for peaks, (atoms/cm$^3$) | ~1.1 × 10$^{21}$ | ~0.8 × 10$^{21}$ | ~0.6 × 10$^{21}$ |
| Expected concentration of phosphorus for troughs, (atoms/cm$^3$) | | ~3 × 10$^{20}$ | |

As a control, 25 solar cells were prepared as described in Russian Patent No. 2139601. In this procedure, an initial $n^+$ layer was formed by applying a silicon dioxide film containing 15% (by weight) $P_2O_5$ to the front surface. The resulting initial $n^+$ layer had a sheet resistance of 35 ohm and a depth of 1.2 μm. The mean values of the parameters of the control solar cells were as follows: $V_{OC}$=616 mV, $J_{SC}$=35.9 mA/cm$^2$, efficiency=16.2%

As shown in FIG. 3, the short circuit current density ($J_{SC}$) of the solar cells depended on the depth of etching during texturing, and was maximal at average etching depths of more than approximately 4 μm.

As shown in FIG. 4, the fill factor (FF) of the solar cells depended on the depth of etching during texturing, and was maximal when the average etching depth was less than approximately 8 μm.

As shown in FIG. 5, the efficiency of the solar cells depended on the etching depth, and was maximal when the average etching depth was in a range of approximately 4-12 μm.

As shown in Tables 1-3 and in FIG. 5, the efficiency of the solar cells was higher than that of the efficiency of the control cells (16.2%), and efficiencies of over 17% were obtained. The relative gain in efficiency over control values was approximately 3-5%.

These results show that the formation of an initial $n^+$ layer and its removal by etching, as described hereinabove, results in high solar cell efficiency when the etching depth is within an optimal range for which relatively high values of both short circuit current and fill factor are obtained.

As further shown in Tables 1-3, laser p-n junction separation did not improve the shunt resistance to any significant extent, and the solar cell efficiency was even reduced by 0.6-0.8% by laser separation, possibly due to a decrease of the area of the working surface.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of producing a photovoltaic cell, the method comprising:
    a) doping a first surface of a semiconductive substrate with an n-dopant so as to form a first $n^+$layer in said substrate;
    b) doping a second surface of said substrate with a p-dopant so as to form a $p^+$layer in said substrate;
    c) removing a portion of said first $n^+$layer from said first surface of said substrate, such that a concentration of said n-dopant remaining in said first surface of said substrate is variable throughout said first surface;
    d) doping said first surface of said substrate with an n-dopant so as to form a second $n^+$layer, such that a concentration of said n-dopant in said second $n^+$layer is variable throughout said first surface; and
    e) forming electrical contacts on each of said first surface and said second surface,
    thereby producing said photovoltaic cell,
    wherein said doping with said n-dopant so as to form said first $n^+$layer and said doping with said p-dopant so as to form said $p^+$layer is effected by:
    (i) applying a film comprising said p-dopant to said second surface;
    (ii) applying a film comprising said n-dopant to said first surface; and
    (iii) heating said substrate,
    thereby simultaneously forming said first $n^+$layer and said $p^+$layer.

2. The method of claim 1, wherein said first $n^+$layer is characterized by a sheet resistance of less than 30 ohms.

3. The method of claim 1, wherein said first $n^+$layer has a depth in a range of 0.4-2 μm.

4. The method of claim 1, wherein said second n$^+$layer is characterized by a sheet resistance in a range of 30-100 ohms.

5. The method of claim 1, wherein said second n$^+$layer has a depth in a range of 0.2-0.7 µm.

6. The method of claim 1, wherein said removing said portion of said first n$^+$layer from said first surface comprises texturing said first surface.

7. The method of claim 6, wherein said texturing generates peaks and troughs in said first surface, wherein a concentration of said n-dopant remaining in said first surface following texturing is greater in said peaks than in said troughs.

8. The method of claim 7, wherein a concentration of said n-dopant in said second n$^+$layer is greater in said peaks than in said troughs.

9. The method of claim 8, wherein a concentration of said n-dopant in said peaks in said second n$^+$layer is at least twice a concentration of said n-dopant in said troughs in said second n$^+$layer.

10. The method of claim 8, wherein a concentration of said n-dopant in said peaks in said second n$^+$layer is at least $5 \cdot 10^{20}$ atoms/cm$^3$.

11. The method of claim 8, wherein a concentration of said n-dopant in said troughs in said second n$^+$layer is less than $10^{21}$ atoms/cm$^3$.

12. The method of claim 1, wherein removing said portion of said n$^+$layer from said first surface comprises etching said first surface to an average depth in a range of from 4 µm to 12 µm.

13. The method of claim 1, wherein said substrate is an n-type semiconductor prior to said doping.

14. The method of claim 1, wherein said substrate is a p-type semiconductor prior to said doping.

15. The method of claim 1, further comprising applying an antireflective coating.

16. The method of claim 15, wherein said antireflective coating is applied to said second surface subsequent to forming said p$^+$layer and prior to forming said second n$^+$layer.

17. The method of claim 15, wherein said antireflective coating is applied to said first surface subsequent to forming said second n$^+$layer.

18. A method of producing a photovoltaic cell, the method comprising:
   a) applying a film comprising a p-dopant to a second surface of a semiconductive substrate;
   b) removing said film comprising said p-dopant from a first surface of said substrate and from an edge of said substrate;
   c) applying a film comprising an n-dopant to said first surface;
   d) heating said substrate, so as to simultaneously form a first n$^+$layer on said first surface and a p$^+$layer on said second surface of said substrate;
   e) removing a portion of said first n$^+$layer from said first surface of said substrate, such that a concentration of said n-dopant remaining in said first surface of said substrate is variable throughout said first surface;
   doping said first surface of said substrate with an n-dopant so as to form a second n$^+$layer, such that a concentration of said n-dopant in said second n$^+$layer is variable throughout said first surface; and
   g) forming electrical contacts on each of said first surface and said second surface,
   thereby producing said photovoltaic cell.

19. The method of claim 18, wherein said first n$^+$layer is characterized by a sheet resistance of less than 30 ohm.

20. The method of claim 18, wherein said first n$^+$layer has a depth in a range of 0.4-2 µm.

21. The method of claim 18, wherein said second n$^+$layer is characterized by a sheet resistance in a range of 30-100 ohm.

22. The method of claim 18, wherein said second n$^+$layer has a depth in a range of 0.2-0.7 µm.

23. The method of claim 18, wherein said removing said portion of said first n$^+$layer from said first surface comprises texturing said first surface.

24. The method of claim 23, wherein said texturing generates peaks and troughs in said first surface, wherein a concentration of said n-dopant remaining in said first surface following texturing is greater in said peaks than in said troughs.

25. The method of claim 18, wherein removing said portion of said n$^+$layer from said first surface comprises etching said first surface to an average depth in a range of from 4 µm to 12 µm.

26. The method of claim 18, wherein said film comprising said p-dopant comprises boron oxide.

27. The method of claim 18, wherein said film comprising said n-dopant comprises phosphorus pentoxide.

28. The method of claim 18, wherein said removing of said film comprises washing said first surface of said substrate.

29. The method of claim 18, wherein said removing said film comprises removing said film from an area bordering an edge of said substrate, said area having a width in a range of 0.1-1 mm.

30. The method of claim 18, wherein said substrate is an n-type semiconductor prior to forming said first n$^+$layer and said p$^+$layer.

31. The method of claim 18, wherein said substrate is a p-type semiconductor prior to forming said first n$^+$layer and said p$^+$layer.

32. The method of claim 18, further comprising applying an antireflective coating.

33. The method of claim 32, wherein said antireflective coating is applied to said second surface subsequent to forming said p$^+$layer and prior to forming said second n$^+$layer.

34. The method of claim 32, wherein said antireflective coating is applied to said first surface subsequent to forming said second n$^+$layer.

* * * * *